(12) United States Patent
Kaelberer et al.

(10) Patent No.: US 10,020,169 B2
(45) Date of Patent: Jul. 10, 2018

(54) ETCHING DEVICE AND ETCHING METHOD

(71) Applicant: Robert Bosch GmbH, Stuttgart (DE)

(72) Inventors: Arnd Kaelberer, Schlierbach (DE); Christian Zielke, Eningen Unter Achalm (DE); Hans Artmann, Boeblingen-Dagersheim (DE); Oliver Breitschaedel, Gomaringen (DE); Peter Borwin Staffeld, Stuttgart (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 15/402,648

(22) Filed: Jan. 10, 2017

(65) Prior Publication Data

US 2017/0207067 A1 Jul. 20, 2017

(30) Foreign Application Priority Data

Jan. 17, 2016 (DE) .......................... 10 2016 200 506

(51) Int. Cl.
*H01J 37/32* (2006.01)
*C23C 16/50* (2006.01)
*C23C 16/455* (2006.01)

(52) U.S. Cl.
CPC .... *H01J 37/3244* (2013.01); *H01J 37/32798* (2013.01); *C23C 16/455* (2013.01); *C23C 16/50* (2013.01); *H01J 2237/334* (2013.01)

(58) Field of Classification Search
CPC ............ H01J 37/3244; H01J 37/32798; H01J 2237/334; C23C 16/50; C23C 16/455
See application file for complete search history.

(56) References Cited

U.S. PATENT DOCUMENTS

| 6,221,784 | B1 | 4/2001 | Schmidt et al. | |
| 7,358,192 | B2* | 4/2008 | Merry | H01J 37/32357 156/345.31 |
| 8,945,414 | B1* | 2/2015 | Su | H01J 37/32357 216/79 |
| 2006/0162661 | A1* | 7/2006 | Jung | C23C 16/345 118/723 ER |
| 2007/0026540 | A1* | 2/2007 | Nooten | C23C 16/045 438/5 |
| 2009/0068849 | A1* | 3/2009 | Endo | C23C 16/4412 438/763 |

(Continued)

FOREIGN PATENT DOCUMENTS

| DE | 19840437 A1 | 6/1999 |
| WO | 02095800 A2 | 11/2002 |

*Primary Examiner* — Jeffrie R Lund
(74) *Attorney, Agent, or Firm* — Norton Rose Fulbright US LLP; Gerard Messina

(57) ABSTRACT

An etching device and an etching method. The etching device includes an etching chamber and a chuck located therein for clamping a substrate to be etched, a plasma generating device surrounding the etching chamber in an area and a gas nozzle distribution device for introducing etching gas, which is situated above the chuck in such a way that an etching gas stream is directed essentially perpendicular to a surface of the substrate to be etched. A moving mechanism may be used to change the distance between the gas nozzle distribution device and the chuck as a function of the etching mode.

11 Claims, 3 Drawing Sheets

(56) References Cited

U.S. PATENT DOCUMENTS

| | | | | |
|---|---|---|---|---|
| 2010/0043975 A1* | 2/2010 | Hayashi | .............. | H01J 37/3244 |
| | | | | 156/345.33 |
| 2010/0243167 A1* | 9/2010 | Hayashi | ............ | H01J 37/32568 |
| | | | | 156/345.43 |
| 2011/0244690 A1* | 10/2011 | Shanker | .................. | C23C 16/44 |
| | | | | 438/703 |
| 2013/0189854 A1* | 7/2013 | Hausmann | .......... | H01L 21/0217 |
| | | | | 438/792 |
| 2014/0110764 A1* | 4/2014 | Niyogi | .................... | C23C 14/04 |
| | | | | 257/288 |
| 2014/0179113 A1* | 6/2014 | Lang | ....................... | H01L 21/02 |
| | | | | 438/758 |
| 2014/0273309 A1* | 9/2014 | Niyogi | .............. | H01L 21/67051 |
| | | | | 438/16 |
| 2016/0276148 A1* | 9/2016 | Qian | ................. | H01J 37/32899 |
| 2017/0207067 A1* | 7/2017 | Kaelberer | ........... | H01J 37/3244 |
| 2017/0301958 A1* | 10/2017 | Deng | ................ | H01M 10/0585 |
| 2017/0309514 A1* | 10/2017 | Rainville | .......... | H01L 21/76834 |

\* cited by examiner

ETCHING DEVICE AND ETCHING METHOD

CROSS REFERENCE

The present application claims the benefit under 35 U.S.C. § 119 of German Patent Application No. DE 10 2016200506.5 filed on Jan. 17, 2016, which is expressly incorporated herein by reference in its entirety.

FIELD

The present invention relates to an etching device and an etching method.

Although applicable to arbitrary structures, the present invention and the problems underlying it are explained by referring to micromechanical structures in silicon, in which sacrificial layers are removed.

BACKGROUND INFORMATION

Micromechanical components based on silicon, for example, sensors or micromirrors, are generally made up of one or multiple conductive functional layers of silicon. The areas of the functional layers that represent the movable part of the MEMS are situated directly on a sacrificial layer. The non-movable areas are, in contrast, connected directly on the substrate without a sacrificial layer. Movable and fixed areas are connected with one another via a suitable suspension. At the end of the manufacturing process, the sacrificial layer is selectively removed with the aid of a suitable isotropic etching method, which makes the component functional. Wet chemical methods are often not usable here, since very closely adjacent functional elements become stuck during the subsequent drying of the MEMS structure. Plasma-assisted or plasma-free isotropic etching methods are necessary, in which exclusively gaseous reactants and products are participants.

Very different types of silicon oxide are common materials for sacrificial layers. Due to the extreme layer stress of silicon oxide in combination with silicon as a functional material, only very thin sacrificial layers may be implemented (usually in the range of 0.1 µm to 2 µm). The selective removal of the sacrificial layer may take place here, for example, with the aid of HF gas phase etching. In this case, however, the etching rate is limited, causing the maximum usable volume of the sacrificial layer to be limited.

One variant is the use of epitaxial polysilicon as the sacrificial material. High deposition rates favor the formation of high-volume sacrificial structures. Isotropic etching methods are known which may be used to remove the sacrificial structures using very high etching rates. Both plasma-assisted and plasma-free etching methods are suitable for this. In both cases, polysilicon may be etched at high selectivity compared to usual mask materials such as silicon oxide, silicon nitride, aluminum or photoresist.

A particular focus is on the design of 3D MEMS structures, in which the functional structure and the sacrificial structure are made up of the same material (e.g., epitaxial polysilicon). The functional structure is protected against etching attacks on all surfaces by suitable passivation materials (e.g., $SiO_2$). If this technology is applied, buried sacrificial structures of arbitrary complexity extending broadly laterally and vertically may be created. A great challenge is to completely remove the sacrificial structures in the isotropic etching step.

Plasma-assisted and plasma-free etching methods are fundamentally different. Purely chemical plasma-free etching is very well suited for the removal of buried sacrificial material. Compounds such as $XeF_2$, $ClF$, $ClF_3$, $ClF_5$, $BrF_3$, $BrF_5$, $IF_5$, $IF_5$ etch silicon spontaneously, while common mask materials such as $SiO_2$, $Si_3N_4$, $SiON$, silicon-rich nitrides or metals such as Al are etched very slowly (selectivity up to 1000). Great undercutting widths may be implemented here, even in extremely narrow sacrificial structures (<1 µm). Even at a great distance from the access opening in the mask, the etching rate remains nearly constant. There is also nearly no dependence of the etching rate on the size of the access. However, the etching rate is often limited by the vapor pressure of the used chemical (only approximately 3 torr in the case of $XeF_2$). If too much sacrificial material is offered openly, the etching rate drops sharply. In other words, the volume etching rate is low (typically 11 $mm^3$/min). If MEMS components having a high-volume sacrificial structure and a large open surface area >10% are to be etched, long etching times must be expected.

Plasma-assisted isotropic etching using fluorine compounds such as $F_2$, $SF_6$, $CF_4$ or $NF_3$ is also suitable for the removal of buried sacrificial material. In this case, the fluorine compound is activated in the plasma; the free fluorine radicals etch silicon spontaneously and without additional activation energy using ion bombardment.

Mask materials such as $SiO_2$, $Si_3N_4$, $SiON$, silicon-rich nitrides or metals such as AL are only etched very slowly (selectivity >1000). Only by supplying activation energy by ion bombardment is it possible to remove these materials at higher etching rates. When silicon is etched, very high volume etching rates are possible (e.g., >500 $mm^3$/min); however, the etching rate drops as the distance to the access opening increases. This is due to the fact that the radicals react not only with the silicon surface, but also with themselves, as a result of which the concentration and thus the etching rate decreases as the undercutting width increases. Furthermore, the etching rate depends strongly on the size of the access opening. The smaller the access, the lower the etching rate. Accordingly, the etching rate also drops sharply in the case of constrictions of the sacrificial structure. If MEMS components having a high-volume sacrificial structure and a large, open surface area >10% are to be etched, the major portion of the sacrificial silicon may be removed in a short etching time with the aid of a plasma-assisted method, as long as there is no limitation due to small etching accesses <20 µm.

If silicon is used as a sacrificial material in combination with arbitrary passivation material, the mask must be structured prior to the sacrificial layer etching. Silicon is released in this case. In air, a thin film of natural silicon oxide is always formed on the silicon surface (~5 nm). To begin sacrificial layer etching, it is necessary to initially remove this natural oxide in a suitable manner. Plasma-assisted and plasma-free etching methods are again suitable for this purpose. If the passivation material is $SiO_2$, the opening with the aid of $CF_4$ plasma in combination with directed ion bombardment is common practice. In this case, the natural oxide on the surface may be selectively removed shortly before the sacrificial layer etching. A short isotropic HF gas phase etching step may also be used. Here, oxide is selectively and isotropically removed. If an interruption should occur during the sacrificial layer etching and the wafer is exposed to air, natural oxide will also form on buried sacrificial silicon on the etch fronts. This may result in an etching delay or even a complete stop of the etching progress when the sacrificial layer etching is resumed. In order to avoid this, it is no longer possible to work with plasma-assisted methods, since no ion bombardment is possible on buried structures. In order to provide a remedy, all that remains is an isotropic plasma-free etching step, e.g., HF gas phase etching for SiO$_2$ as passivation.

This basically provides a sacrificial layer etching under a combination of plasma-assisted and plasma-free etching methods.

Generally, separate modules for plasma-free (described, for example, in German Patent Application DE 198 40 437 A1) or plasma-assisted etching are provided in the related art. The modules may then be linked with one another via a handling system. In this case, it would be possible to initially machine the wafer in the plasma module. In this case, the natural oxide on the surface could be opened and the isotropic plasma-assisted sacrificial layer etching could be started. After the etching was completed, the wafer would have to be unloaded and transferred into the next etching module. In this case, a further sacrificial layer etching could be carried out with the aid of a plasma-free etching method. Should natural oxide have been formed on buried sacrificial material for any reasons, the wafer would have to be unloaded again and transferred to a third module suitable for removing the natural oxide, e.g., HF gas phase etching. This results in high costs for at least three etching modules and a handling system in order to be able to hold the wafer in a vacuum between the individual process steps.

Moreover, long process durations result from multiple separate etching and handling steps and a distribution of the error possibilities, since all modules have to be available at the same time. In addition, there are increased maintenance costs because four system elements have to be serviced, a complication due to four different system elements including different software control, if necessary, and an increased risk of product damage due to multiple handling.

U.S. Pat. No. 6,221,784 B1 and PCT Application No. WO 02/095800 A2 describe etching modules in which plasma-assisted and plasma-free etching are to be combined. Here, structures are explicitly assumed in which useful material and sacrificial material differ. There is no way to use the plasma-activated species for isotropic etching at a high etching rate. Similarly, there is no way to remove buried natural oxide on etch fronts with the aid of gaseous HF.

SUMMARY

The present invention provides an etching device and an etching method. Preferred refinements are described herein.

In accordance with the present invention, plasma-assisted as well as plasma-free etching methods are effectively combined on an etching device, plasma-assisted and plasma-free etching being possible both in isotropic and anisotropic aspects.

In order to create optimized etching conditions, in particular in plasma-free etching, a movable gas nozzle distribution device (showerhead) or a movable chuck is provided. By adjusting the distance to the wafer surface, the plasma-free etching process may thus be optimized in comparison with the plasma-assisted etching process.

For example, the following process steps are possible in a single etching step:
  anisotropic opening of the passivation SiO$_2$, Si$_3$N$_4$, SiON, silicon-rich nitrides or metals such as Al on the structure surface;
  anisotropic or isotropic removal of natural SiO$_2$ on silicon on the structural surface and also on buried silicon with the aid of sputtering or gaseous HF;
  isotropic etching of sacrificial silicon with the aid of plasma-activated species such as fluorine, chlorine or bromine radicals;
  isotropic etching of sacrificial silicon with the aid of chemically active species such as XeF$_2$, ClF, ClF$_3$, ClF$_5$, BrF$_3$, BrF$_5$, IF$_5$, IF$_7$;
  isotropic deposition of plasma polymer from C$_4$F$_8$.

An etching device according to the present invention may be implemented by installing additional suitable gas lines for the various etching gases and an actuator to an existing plasma etching module. The gases flow into the etching chamber through the gas nozzle distribution device, pass through a plasma coil in the plasma etching mode or strike the wafer surface from a close distance in the non-plasma etching mode. After adsorption, the reaction takes place using the appropriate material. The reaction products and excess reaction gas may be suctioned off using the high vacuum pump before the next process step is started.

By alternate etching and passivation, for example, a trench etching may be implemented. The etching device according to the present invention is particularly suitable for the isotropic removal of high-volume sacrificial structures from MEMS components using a very high etching rate, in which both the sacrificial material and the functional material are made of silicon. The use of gaseous HF makes it possible to remove buried natural oxide, as a result of which an etching delay is prevented.

According to a preferred specific embodiment, an inner wall of the etching chamber may be temperature-controlled. Depending on the etching mode and the etching gas composition, this makes it possible to set optimized process conditions.

According to another preferred specific embodiment, a controllable gas supply device is provided, with the aid of which different etching gases may be fed to the etching chamber. Different etching processes may thus be set automatically.

According to another preferred specific embodiment, the etching gases may be optionally pulsed or supplied continuously. This makes it possible to set the optimal conditions for the etching gas supply.

According to another preferred specific embodiment, the chuck may be brought to a predetermined electrical potential with the aid of a biasing device. Thus, a sputtering effect may be optionally achieved.

According to another preferred specific embodiment, a control unit is provided, with the aid of which the etching gas composition and the etching mode may be controlled automatically. This makes it possible to optimize the speed of the etching processes.

According to another preferred specific embodiment, the plasma generating device has a coil device surrounding the area. A plasma may thus be formed in a favorable manner.

According to another preferred specific embodiment, the area forms a constriction of the etching chamber. This makes it possible to achieve a high energy density of the plasma.

BRIEF DESCRIPTION OF THE DRAWINGS

The present invention is explained in greater detail below based on the exemplary embodiments presented in the figures.

DETAILED DESCRIPTION OF EXAMPLE EMBODIMENTS

Identical reference symbols and numerals in the figures denote identical elements or elements having an identical function.

Figure 1:
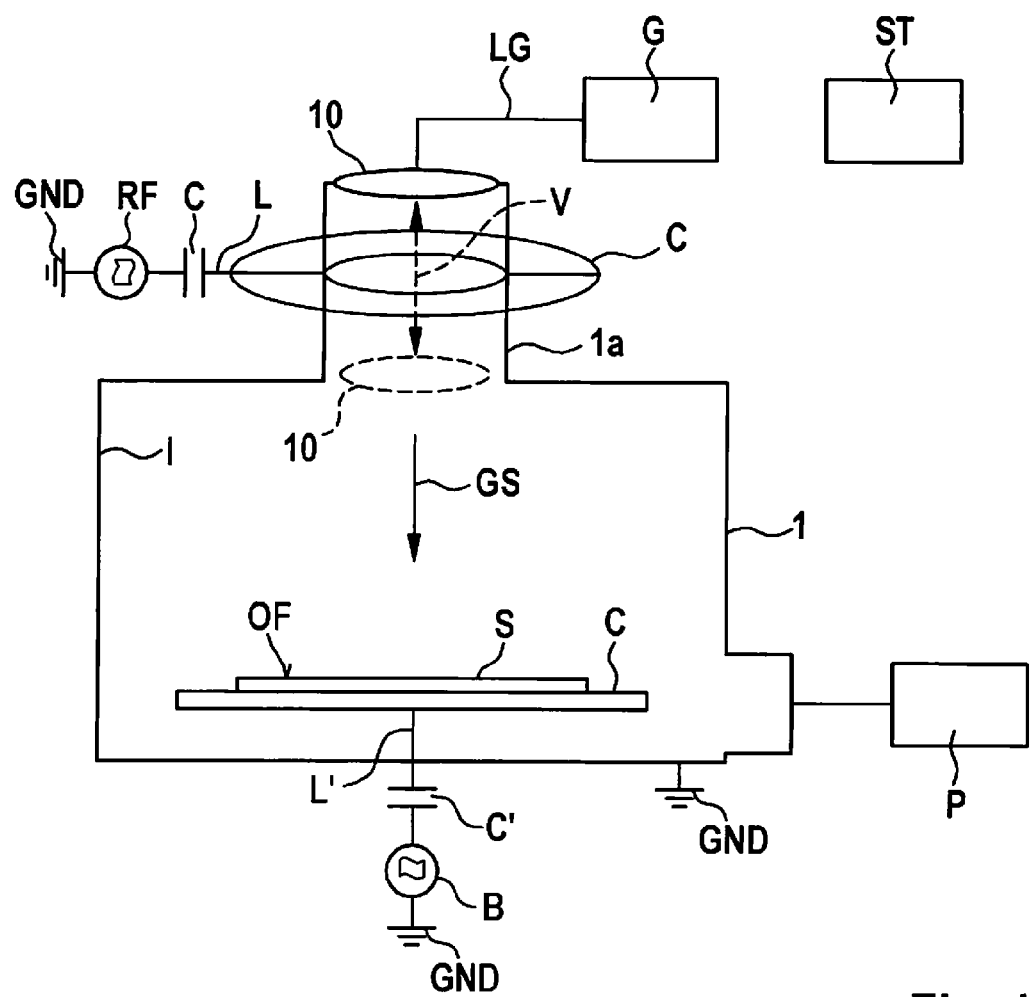
FIG. 1 shows a schematic cross-sectional representation for elucidating an etching device and a corresponding etching method according to a first specific embodiment of the present invention.

FIG. 1 shows a schematic cross-sectional representation for elucidating an etching device and a corresponding etching method according to a first specific embodiment of the present invention.

In FIG. 1, reference numeral 1 denotes an etching chamber, within which a chuck C is situated, on which a substrate S having a surface OF is clamped. The clamping takes place, for example, with the aid of suction nozzles or a mechanical clamping device. A width of etching chamber 1 is advantageously only slightly greater than the diameter of chuck C in order to achieve a suitable etching gas density.

Connected to etching chamber 1 is a pump device P for producing a desired process pressure and for pumping off the etching gas, in particular when a change of the etching gas is required. With the aid of an electrical line L', chuck C is connected via a capacitor device C' to a biasing device B, which on the other hand is connected to ground potential GND. Biasing device B is used for applying a desired electrical potential to chuck C if a sputtering defect is desired. The chuck is preferably temperature-controllable, for example, in the temperature range between −10° C. and 100° C.

An inner wall I of etching chamber 1 may also be temperature-controlled, for example, in the same temperature range between −10° C. and 100° C. In the upper area, etching chamber 1 has a constricted area 1a which is surrounded by a plasma generating device C, which includes a circular coil device, which is connected via an electrical line L and a capacitor device C and a radio frequency generating device RF, which is in turn connected to ground potential GND.

Reference numeral 10 denotes a gas nozzle distribution device which is situated on the upper end of constricted area 1a and through which etching gas may be introduced, which is supplied from a gas supply device G via a line device LG. Line device LG may also be temperature-controlled in the range between −10° C. and 100° C.

Gas supply device G is connected to multiple gas sources (not shown), from which the particularly required etching gases may be extracted. A control unit denoted by reference symbol ST provides for an automatic selection of the required gas source or etching gas sources and is also used for adjusting gas nozzle distribution device 10 as a function of a selected etching mode, which is described in greater detail below.

Gas nozzle distribution device 10 is situated above chuck C in such a way that an etching gas stream GS is directed essentially perpendicular to surface OF of substrate S to be etched.

It may be moved with respect to surface OF of the substrate to be etched by an actuator device (not shown) in such a way that it is situated in a plasma etching mode at such a first distance from surface OF that etching gas stream GS passes through constricted area 1a surrounded by plasma generating device C. The selected etching gas passing through is thus activated by plasma generating device C and then reaches surface OF of substrate S to be etched.

In a non-plasma etching mode, on the other hand, gas nozzle distribution device 10 is moved in the direction of surface OF of the substrate through constricted area 1a including surrounding plasma generating device C, so that it is located at a second, smaller distance from surface OF, which results in a better etching condition for isotropic etching, since the etching volume is reduced.

This movability is schematically indicated by a double arrow having reference symbol V.

Thus, appropriate programming of control unit ST may be used for configuring alternating plasma-free and plasma-assisted etching cycles using different etching gases.

For the plasma-free etching, for example, $XeF_2$ (xenon difluoride) ClF (chlorine monofluoride), $ClF_3$ (chlorine trifluoride), $ClF_5$ (chlorine pentafluoride), $BF_3$ (bromine trifluoride), $BF_5$ (bromine pentafluoride), $IF_5$ (iodine pentafluoride), $IF_5$ (iodine heptafluoride) may be used as etching gases.

For a plasma-assisted etching, for example, $F_2$ (fluorine gas), $SF_6$ (sulfur hexafluoride), $CF_4$ (carbon tetrafluoride), $CHF_3$ (trifluoromethane) $CH_2F_3$ (trifluoromethanecation), $C_2F_6$ (hexafluoroethane), $C_3F_8$ (octafluoropropane) or $NF_3$ (nitrogen trifluoride), etc., may be used. The above etching processes are in particular suitable for sacrificial layer etching.

An isotropic opening of buried natural $SiO_2$ may be achieved, for example, by anhydrous HF gas, isopropanol, etc. Polymer passivation is, for example, possible with the aid of $C_4F_8$ (octafluorocyclobutane).

Ar (argon), $N_2$ (nitrogen), $O_2$ (oxygen), $H_2$ (hydrogen), $Cl_2$ (chlorine gas), $Br_2$ (bromine gas), $I_2$ (iodine gas), HCl (hydrogen chloride gas), HBr (hydrogen bromide gas), HI (hydrogen iodide gas) etc., are conceivable as additional etching gases.

It is advantageous that all etching processes are possible under continuous flux or pulsed flux.

Plasma generating device C above substrate S typically has a distance of 30 cm from surface OF.

Another possibility is a protective ring for the edge of substrate S (not shown) which is movable in the z-direction.

Furthermore, it is possible to implement an optical end point detection for all etching steps.

Figure 2:
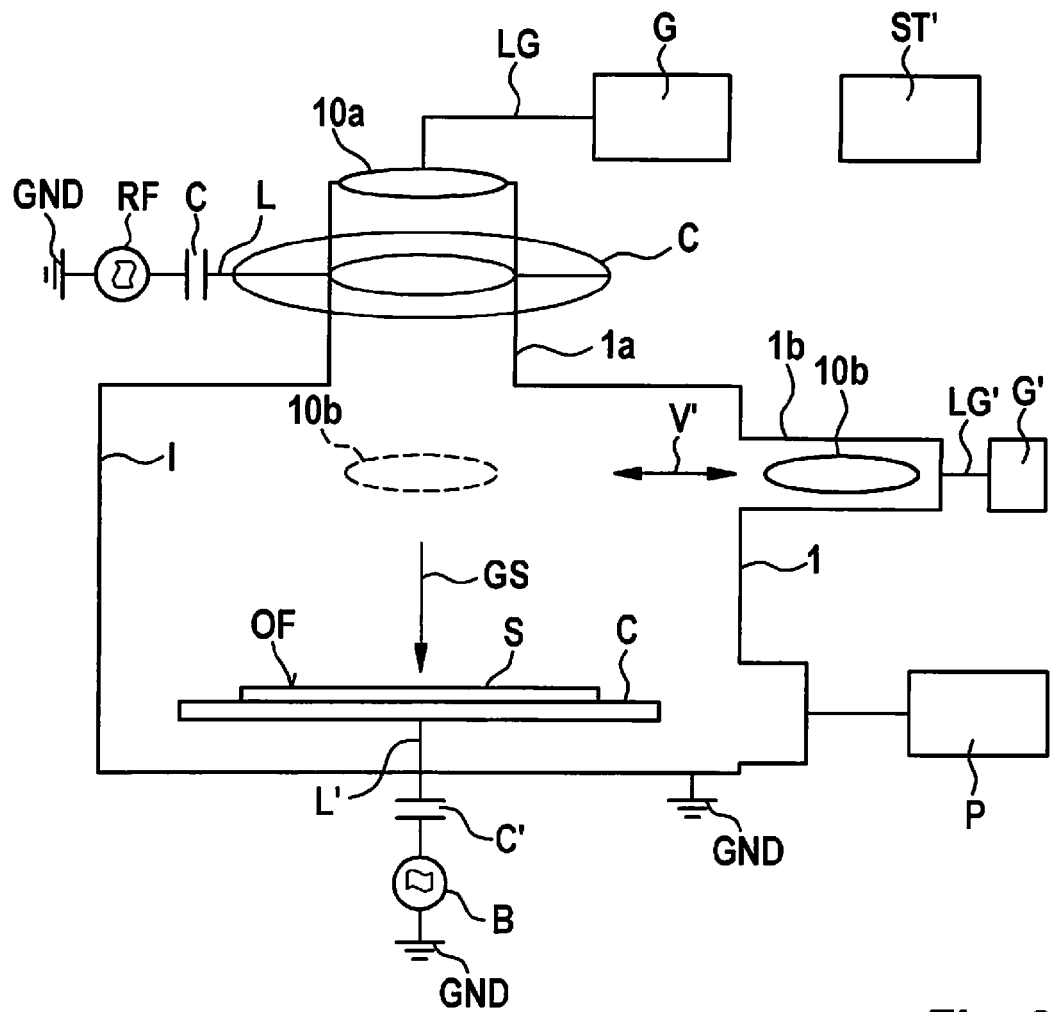
FIG. 2 shows a schematic cross-sectional representation for elucidating an etching device and a corresponding etching method according to a second specific embodiment of the present invention.

FIG. 2 shows a schematic cross-sectional representation for elucidating an etching device and a corresponding etching method according to a second specific embodiment of the present invention.

According to the second specific embodiment, in contrast to the above-described first specific embodiment, a first gas nozzle distribution device 10a and a second gas nozzle distribution device 10b are provided.

In contrast to the first specific embodiment, first gas nozzle distribution device 10a is provided stationarily above plasma generating device C.

Second gas nozzle distribution device 10b is provided in a lateral recess 1b of etching chamber 1 and has a movability V' along the direction indicated by the double arrow, i.e., in the horizontal direction in the drawing. It is connected to a second gas supply device G' via a line device LG'.

In plasma-free etching, second gas nozzle distribution device 10b is located in recess 1b and is deactivated.

In plasma-assisted etching, on the other hand, first gas nozzle distribution device 10a is deactivated and second gas nozzle distribution device 10*b* is moved in the horizontal direction above surface OF of the substrate in such a way that an etching gas stream GS exiting it is directed essentially perpendicular to surface OF of substrate S to be etched.

In this second specific embodiment, an appropriately modified control unit ST' provides for the etching gases to be provided by gas supply devices G, G' and for the movability of second gas nozzle distribution device 10, so that this arrangement yields the same effect as in the first specific embodiment described above.

Figure 3:
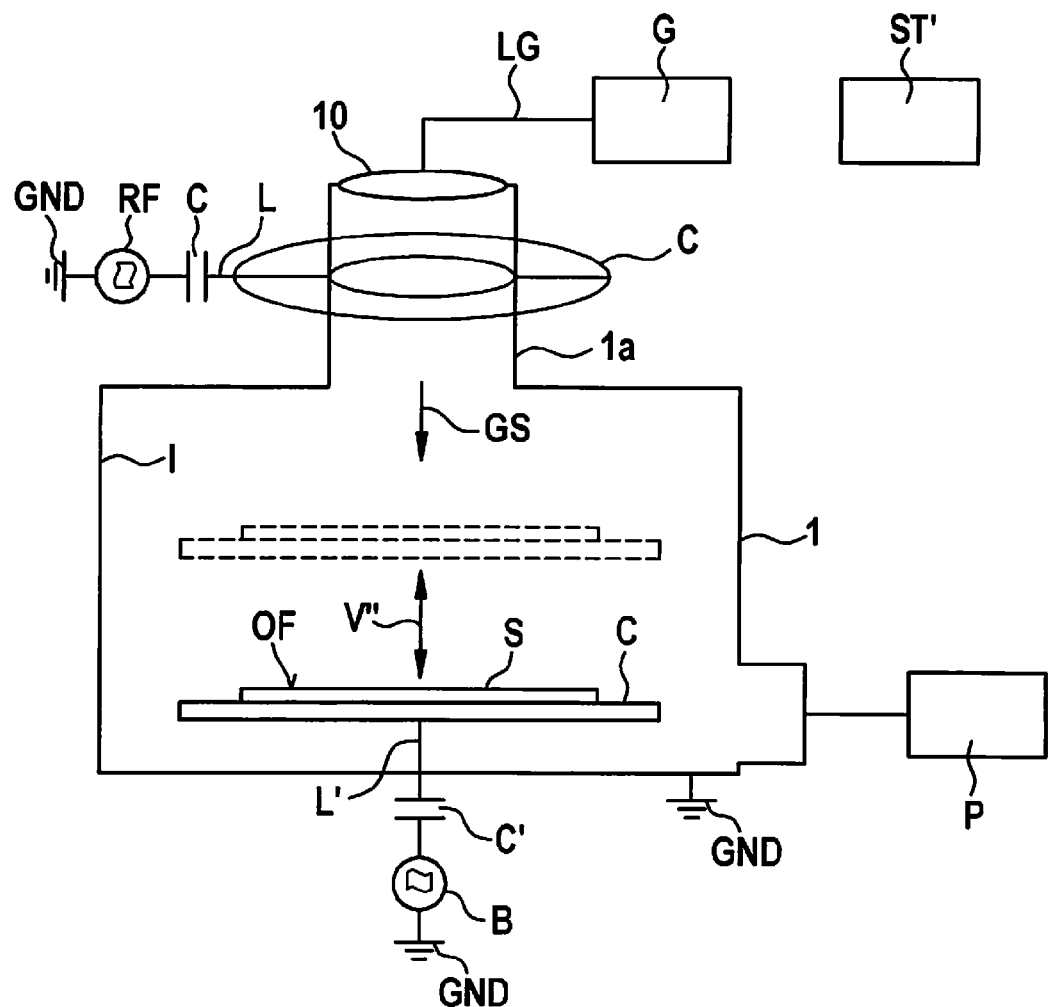
FIG. 3 shows a schematic cross-sectional representation for elucidating an etching device and a corresponding etching method according to a third specific embodiment of the present invention.

FIG. 3 shows a schematic cross-sectional representation for elucidating an etching device and a corresponding etching method according to a third specific embodiment of the present invention.

In the third specific embodiment, gas nozzle distribution device 10, which is situated above the plasma generating device, is also stationary; however, chuck C may be adjusted in direction of travel V" in such a way that substrate S may be brought closer to gas nozzle distribution device 10 during a plasma-free etching process. Consequently, in this specific embodiment, the same effect as in the above-described first and second specific embodiments is also achievable, namely a reduction in the etching volume in plasma-free etching.

Although the present invention has been described based on preferred specific embodiments, it is not limited thereto, but is instead modifiable in a variety of ways.

In particular, it is possible to design both the gas nozzle distribution device and the chuck to be adjustable, in order, for example, to further reduce the etching volume during plasma-free etching.

The present invention is also not limited to the above-named etching gases, but is instead applicable in principle for arbitrary etching gases or passivation gases.

Furthermore, it is also possible to apply the present invention to an etching chamber, in which a plurality of substrates are to be etched simultaneously.

What is claimed is:

1. An etching device, comprising:
   an etching chamber and a chuck located therein to clamp a substrate to be etched;
   a plasma generating device surrounding the etching chamber in an area; and
   a gas nozzle distribution device to introduce etching gas, the gas nozzle distribution device being situated above the chuck in such a way that an etching gas stream is directed perpendicular to a surface of the substrate to be etched;
   wherein the gas nozzle distribution device is movable with respect to the surface of the substrate to be etched in such a way that, in a plasma etching mode, the gas nozzle distribution device is situated at such a first distance from the surface that the etching gas stream passes through the area surrounded by the plasma generating device, and that, in a non-plasma etching mode, the gas nozzle distribution device is situated at such a second, smaller distance from the surface that the etching gas stream does not pass through the area surrounded by the plasma generating device.

2. The etching device as recited in claim 1, wherein an inner wall of the etching chamber is temperature-controllable.

3. The etching device as recited in claim 1, further comprising:
   a controllable gas supply device with the aid of which different etching gases may be fed to the etching chamber.

4. The etching device as recited in claim 3, wherein the etching gases may be pulsed or supplied continuously in the alternative.

5. The etching device as recited in claim 1, further comprising:
   a biasing device, where the chuck may be brought to a predetermined electrical potential with the aid of the biasing device.

6. The etching device as recited in claim 1, further comprising:
   a control unit with the aid of which the etching gas composition and the etching mode are controllable automatically.

7. The etching device as recited in claim 1, wherein the plasma generating device has a coil device surrounding the area.

8. The etching device as recited in claim 1, wherein the area forms a constriction of the etching chamber.

9. An etching method, comprising:
   clamping a substrate to be etched on a chuck located in an etching chamber, a plasma-generating device surrounding the etching chamber being provided in an area;
   introducing etching gas into the etching chamber with the aid of a gas nozzle distribution device, which is situated above the chuck in such a way that an etching gas stream is directed perpendicular to a surface of the substrate to be etched; and
   in a plasma etching mode, moving the gas nozzle distribution device in such a way with respect to the surface of the substrate to be etched that the gas nozzle distribution device is situated at such a first distance from the surface that the etching gas stream passes through the area of etching chamber surrounded by a plasma generating device; and
   in a non-plasma etching mode, moving the gas nozzle distribution device in such a way with respect to the surface of the substrate to be etched that the gas nozzle distribution device is situated at such a second, smaller distance from the surface that the etching gas stream does not pass through the area surrounded by the plasma generating device.

10. The etching method as recited in claim 9, wherein a sacrificial layer etching process is carried out by alternating the plasma etching mode and the non-plasma etching mode.

11. The etching method as recited in claim 9, wherein a trench etching process is carried out by alternating the plasma etching mode and the non-plasma etching mode.

* * * * *